United States Patent
Pagaila (10) Patent No.: US 9,443,829 B2
(45) Date of Patent: Sep. 13, 2016

(54) SEMICONDUCTOR DEVICE AND METHOD OF DUAL-MOLDING DIE FORMED ON OPPOSITE SIDES OF BUILD-UP INTERCONNECT STRUCTURE

(71) Applicant: STATS ChipPAC, Ltd., Singapore (SG)

(72) Inventor: Reza A. Pagaila, Tangerang (ID)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/728,182

(22) Filed: Jun. 2, 2015

(65) Prior Publication Data

US 2015/0262977 A1   Sep. 17, 2015

Related U.S. Application Data

(60) Continuation of application No. 14/063,274, filed on Oct. 25, 2013, now Pat. No. 9,076,803, which is a continuation of application No. 13/559,430, filed on Jul. 26, 2012, now Pat. No. 8,592,975, which is a continuation of application No. 13/241,153, filed on Sep. 22, 2011, now Pat. No. 8,264,080, which is a division of application No. 12/540,174, filed on Aug. 12, 2009, now Pat. No. 8,039,304.

(51) Int. Cl.
*H01L 21/44* (2006.01)
*H01L 21/48* (2006.01)
(Continued)

(52) U.S. Cl.
CPC ........... *H01L 25/0657* (2013.01); *H01L 21/56* (2013.01); *H01L 21/561* (2013.01); *H01L 21/6835* (2013.01); *H01L 23/3107* (2013.01); *H01L 23/49811* (2013.01); *H01L 23/49816* (2013.01); *H01L 23/49827* (2013.01); *H01L 23/5389* (2013.01); *H01L 23/552* (2013.01); *H01L 24/11* (2013.01); *H01L 24/16* (2013.01); *H01L 24/19* (2013.01); *H01L 24/24* (2013.01); *H01L 24/25* (2013.01); *H01L 24/81* (2013.01); *H01L 24/82* (2013.01); *H01L 24/96* (2013.01);
(Continued)

(58) Field of Classification Search
CPC .......................... H01L 21/56; H01L 23/49811
USPC ........................................... 438/127; 257/737
See application file for complete search history.

(56) References Cited

U.S. PATENT DOCUMENTS

| 5,250,843 A | 10/1993 | Eichelberger |
| 5,353,498 A | 10/1994 | Fillion et al. |

(Continued)

FOREIGN PATENT DOCUMENTS

| CN | 1438686 A | 8/2003 |
| CN | 1537331 A | 10/2004 |

*Primary Examiner* — David S Blum
(74) *Attorney, Agent, or Firm* — Robert D. Atkins; Patent Law Group: Atkins and Associates, P.C.

(57) ABSTRACT

A semiconductor device has a first interconnect structure. A first semiconductor die has an active surface oriented towards and mounted to a first surface of the first interconnect structure. A first encapsulant is deposited over the first interconnect structure and first semiconductor die. A second semiconductor die has an active surface oriented towards and mounted to a second surface of the first interconnect structure opposite the first surface. A plurality of first conductive pillars is formed over the second surface of the first interconnect structure and around the second semiconductor die. A second encapsulant is deposited over the second semiconductor die and around the plurality of first conductive pillars. A second interconnect structure including a conductive layer and bumps are formed over the second encapsulant and electrically connect to the plurality of first conductive pillars and the first and second semiconductor die.

25 Claims, 8 Drawing Sheets

(51) Int. Cl.
*H01L 21/50* (2006.01)
*H01L 23/48* (2006.01)
*H01L 23/52* (2006.01)
*H01L 29/40* (2006.01)
*H01L 25/065* (2006.01)
*H01L 21/56* (2006.01)
*H01L 21/683* (2006.01)
*H01L 23/498* (2006.01)
*H01L 23/538* (2006.01)
*H01L 23/552* (2006.01)
*H01L 23/00* (2006.01)
*H01L 25/00* (2006.01)
*H01L 23/31* (2006.01)

(52) U.S. Cl.
CPC .............. *H01L 24/97* (2013.01); *H01L 25/50* (2013.01); *H01L 21/568* (2013.01); *H01L 23/3128* (2013.01); *H01L 2224/12105* (2013.01); *H01L 2224/16145* (2013.01); *H01L 2224/16227* (2013.01); *H01L 2224/18* (2013.01); *H01L 2224/97* (2013.01); *H01L 2225/06513* (2013.01); *H01L 2225/06527* (2013.01); *H01L 2225/06537* (2013.01); *H01L 2225/06548* (2013.01); *H01L 2924/00011* (2013.01); *H01L 2924/01004* (2013.01); *H01L 2924/014* (2013.01); *H01L 2924/01005* (2013.01); *H01L 2924/01006* (2013.01); *H01L 2924/01013* (2013.01); *H01L 2924/01029* (2013.01); *H01L 2924/01033* (2013.01); *H01L 2924/01047* (2013.01); *H01L 2924/01073* (2013.01); *H01L 2924/01074* (2013.01); *H01L 2924/01076* (2013.01); *H01L 2924/01078* (2013.01); *H01L 2924/01079* (2013.01); *H01L 2924/01082* (2013.01); *H01L 2924/01322* (2013.01); *H01L 2924/09701* (2013.01); *H01L 2924/12041* (2013.01); *H01L 2924/12042* (2013.01); *H01L 2924/1306* (2013.01); *H01L 2924/13091* (2013.01); *H01L 2924/14* (2013.01); *H01L 2924/15311* (2013.01); *H01L 2924/181* (2013.01); *H01L 2924/18161* (2013.01); *H01L 2924/18162* (2013.01); *H01L 2924/19041* (2013.01); *H01L 2924/3025* (2013.01); *H01L 2924/30105* (2013.01)

(56) References Cited

U.S. PATENT DOCUMENTS

| | | |
|---|---|---|
| 5,841,193 A | 11/1998 | Eichelberger |
| 7,138,064 B2 | 11/2006 | Honda |
| 7,619,901 B2 | 11/2009 | Eichelberger et al. |
| 2004/0195691 A1 | 10/2004 | Moriyasu et al. |
| 2006/0063312 A1 | 3/2006 | Kurita |
| 2007/0001281 A1 | 1/2007 | Ishino et al. |
| 2008/0239686 A1 | 10/2008 | Negishi |
| 2008/0315375 A1 | 12/2008 | Eichelberger et al. |
| 2011/0104852 A1 | 5/2011 | Ishino et al. |
| 2011/0127672 A1 | 6/2011 | Suh |

SEMICONDUCTOR DEVICE AND METHOD OF DUAL-MOLDING DIE FORMED ON OPPOSITE SIDES OF BUILD-UP INTERCONNECT STRUCTURE

CLAIM TO DOMESTIC PRIORITY

The present application is a continuation of U.S. patent application Ser. No. 14/063,274, now U.S. Pat. No. 9,076,803, filed Oct. 25, 2013, which is a continuation of U.S. patent application Ser. No. 13/559,430, now U.S. Pat. No. 8,592,975, filed Jul. 26, 2012, which is a continuation of U.S. patent application Ser. No. 13/241,153, now U.S. Pat. No. 8,264,080, filed Sep. 22, 2011, which is a division of U.S. patent application Ser. No. 12/540,174, now U.S. Pat. No. 8,039,304, filed Aug. 12, 2009, which applications are incorporated herein by reference.

FIELD OF THE INVENTION

The present invention relates in general to semiconductor devices and, more particularly, to a semiconductor device and method of dual-molding semiconductor die mounted to opposite sides of a build-up interconnect structure in a fan-out wafer level chip scale package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

The electrical interconnection in a fan-out wafer level chip scale package (FO-WLCSP) containing semiconductor devices stacked on multiple levels can be accomplished with conductive through silicon vias (TSV), through hole vias (THV), or Cu-plated conductive pillars. Vias are formed in silicon or organic material around the die using laser drilling or deep reactive ion etching (DRIE). The vias are filled with conductive material, for example by copper deposition using an electroplating process, to form the conductive TSVs and THVs. The TSVs and THVs further connect through build-up interconnect structures which are formed across each semiconductor die. The TSVs and THVS and build-up interconnect structure have limited input/output (I/O) pin count and interconnect capability, particularly for FO-WLCSP.

The semiconductor die are typically mounted to one side of the build-up interconnect structure in the FO-WLCSP. To accommodate the die, the build-up interconnect structure must be relatively large, which increases manufacturing cost. Alternatively, if the die are mounted to both sides of the build-up interconnect structure, the height of the bumps must be greater than the height of the upper die in order to bond the bumps to the build-up interconnect structure. The large height and corresponding width of the bumps increases the bump pitch and reduces I/O pin count, which is counterproductive for FO-WLCSP.

SUMMARY OF THE INVENTION

A need exists for a higher I/O pin count in FO-WLCSP. Accordingly, in one embodiment, the present invention is a method of making a semiconductor device comprising the steps of providing a first semiconductor die, forming a first interconnect structure over the first semiconductor die, disposing a second semiconductor die over the first interconnect structure opposite the first semiconductor die, and forming a second interconnect structure over the first interconnect structure around the second semiconductor die.

In another embodiment, the present invention is a method of making a semiconductor device comprising the steps of providing a first semiconductor die, disposing a second semiconductor die over the first semiconductor die, and disposing a first interconnect structure around the second semiconductor die.

In another embodiment, the present invention is a method of making a semiconductor device comprising the steps of providing a first semiconductor die, disposing a first interconnect structure over the first semiconductor die, and disposing a second interconnect structure around the first semiconductor die.

In another embodiment, the present invention is a semiconductor device comprising a first semiconductor die and first interconnect structure disposed around the first semiconductor die. A second interconnect structure is disposed over the first semiconductor die.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
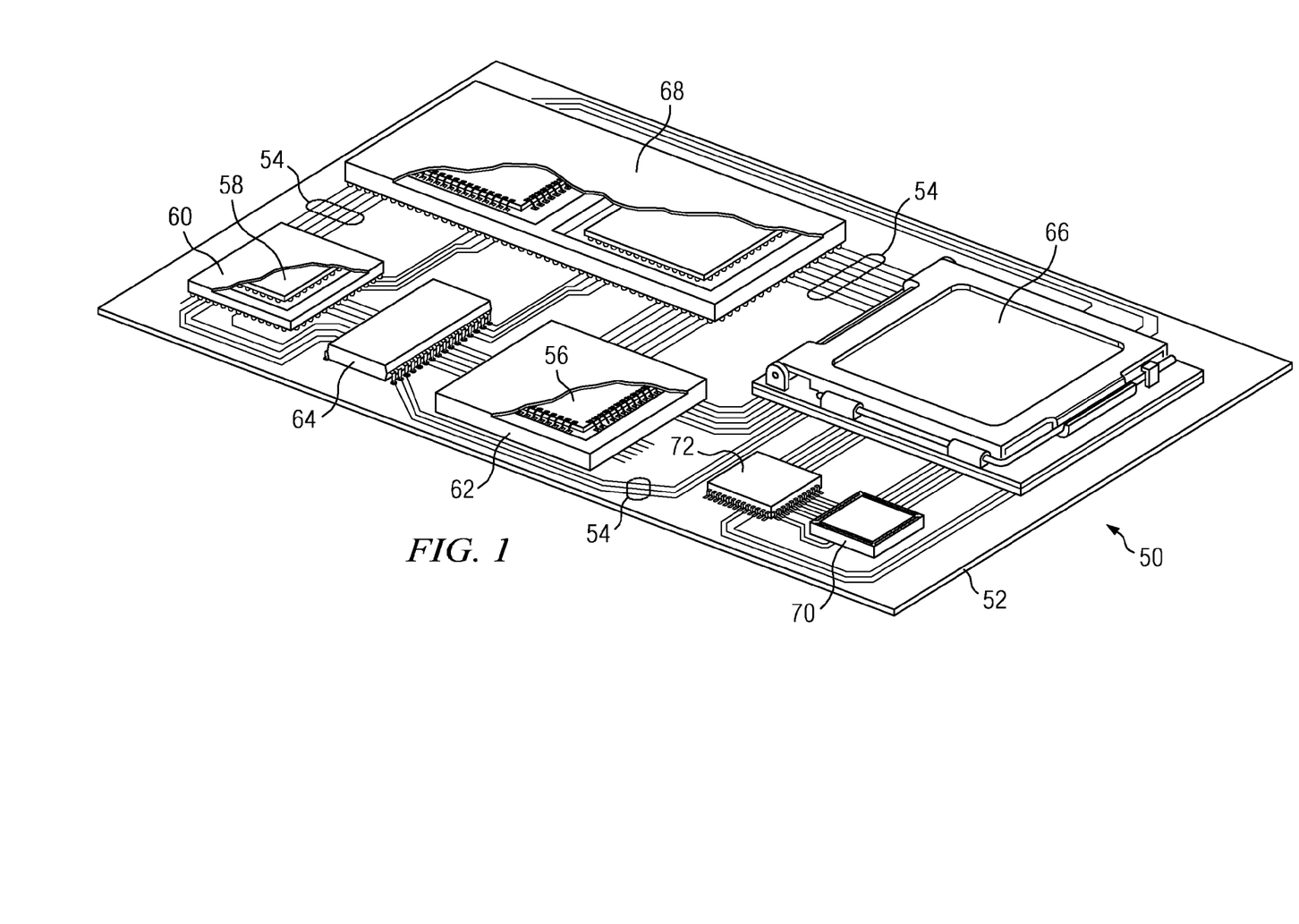
FIG. 1 illustrates a PCB with different types of packages mounted to its surface.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
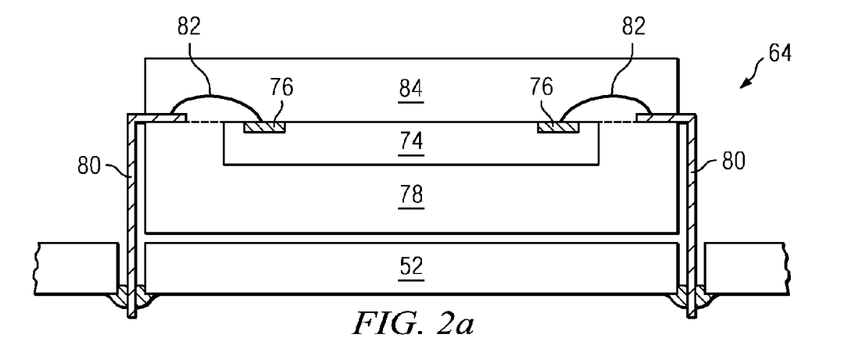
FIGS. 2a-2c illustrate further detail of the representative semiconductor packages mounted to the PCB.

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

Figure 2B:
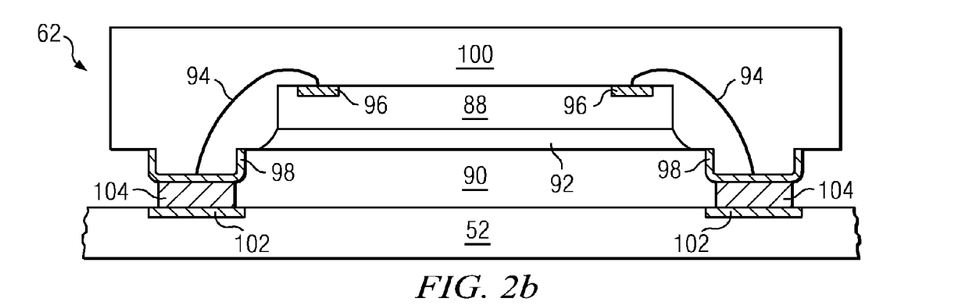

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

Figure 2C:
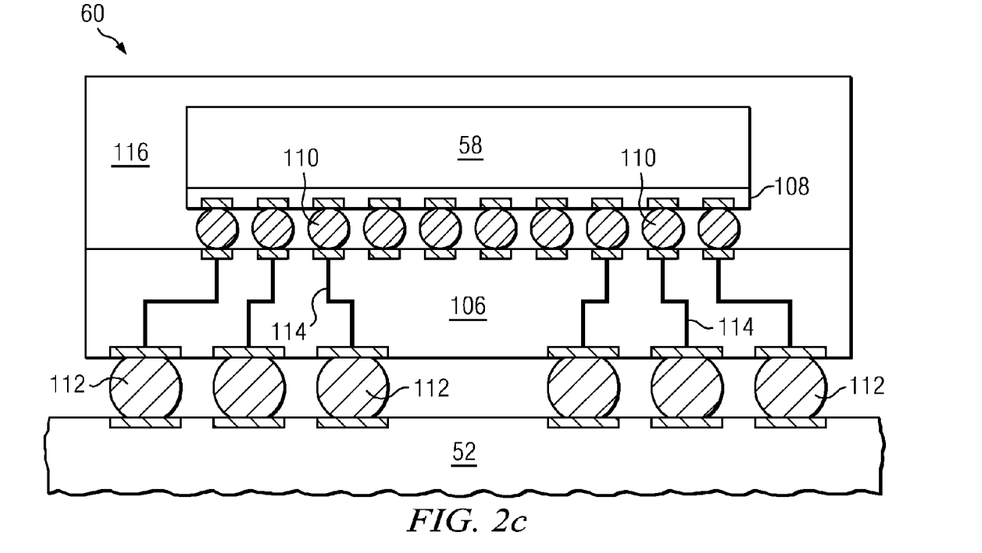

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
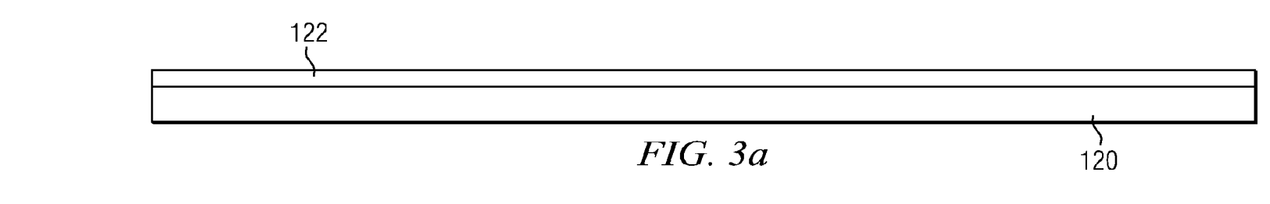
FIGS. 3a-3h illustrate a process of dual-molding semiconductor die mounted to opposite sides of build-up interconnect structure in a FO-WLCSP.

FIGS. 3a-3h illustrate, in relation to FIGS. 1 and 2a-2c, a process of dual-molding semiconductor die mounted to opposite sides of a build-up interconnect structure in a FO-WLCSP. In FIG. 3a, a wafer-form substrate or carrier 120 contains temporary or sacrificial base material such as silicon, polymer, polymer composite, metal, ceramic, glass, glass epoxy, beryllium oxide, or other suitable low-cost, rigid material or bulk semiconductor material for structural support. Carrier 120 can be tape. An optional interface layer 122 can be formed over carrier 120 as a temporary bonding film or etch-stop layer.

Figure 3B:
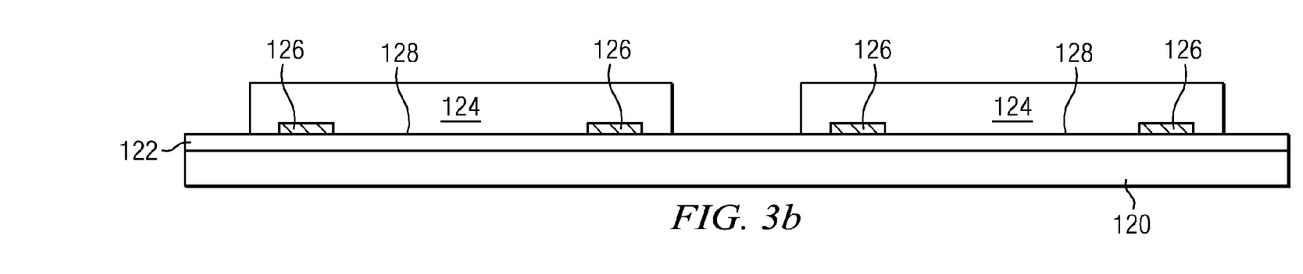

In FIG. 3b, semiconductor die or components 124 are mounted to interface layer 122 with contact pads 126 on active surface 128 oriented toward carrier 120. Active surface 128 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 128 to implement analog circuits or digital circuits, such as digital signal processor (DSP), ASIC, memory, or other signal processing circuit. Semiconductor die 124 may also contain IPD, such as inductors, capacitors, and resistors, for RF signal processing. A typical RF system requires multiple IPDs in one or more semiconductor packages to perform the necessary electrical functions.

Figure 3C:
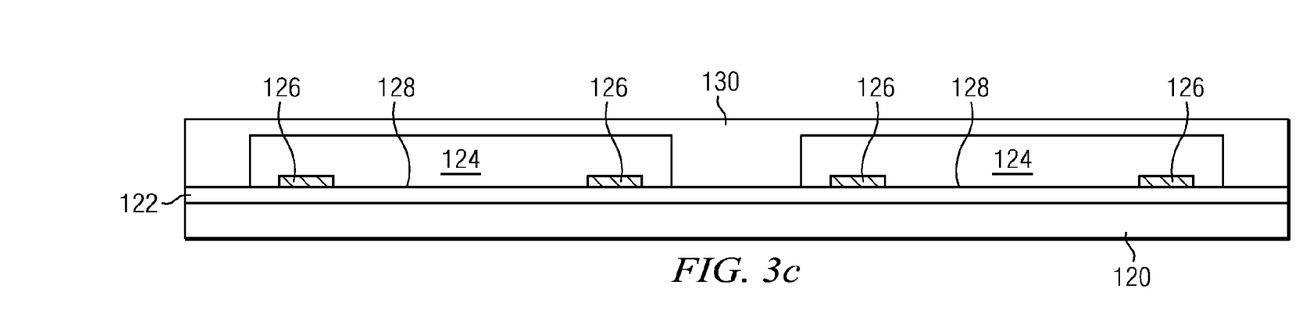

In FIG. 3c, an encapsulant or molding compound 130 is deposited over carrier 120 and active surface 128 of semiconductor die 124 using a paste printing, compressive molding, transfer molding, liquid encapsulant molding, vacuum lamination, spin coating, or other suitable applicator. Encapsulant 130 can be polymer composite material, such as epoxy resin with filler, epoxy acrylate with filler, or polymer with proper filler. Encapsulant 130 is non-conductive and environmentally protects the semiconductor device from external elements and contaminants.

Figure 3D:
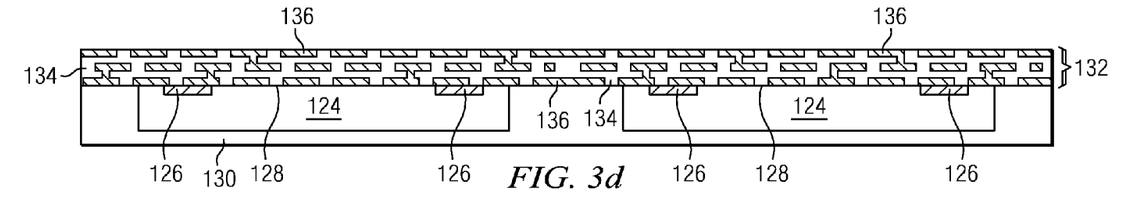

The intermediate structure described in FIGS. 3a-3c is inverted and carrier 120 and optional interface layer 122 are removed by chemical etching, mechanical peel-off, CMP, mechanical grinding, thermal bake, laser scanning, or wet stripping, as shown in FIG. 3d. A build-up interconnect structure 132 is formed over semiconductor die 124 and a surface of encapsulant 130. The build-up interconnect structure 132 includes an insulating or passivation layer 134 containing one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 134 is formed using PVD, CVD, printing, spin coating, spray coating, sintering or thermal oxidation.

The build-up interconnect structure 132 further includes an electrically conductive layer 136 formed in insulating layer 134 using a patterning and deposition process such as PVD, CVD, sputtering, electrolytic plating, and electroless plating process. Conductive layer 136 can be one or more layers of Al, Cu, Sn, Ni, Au, Ag, or other suitable electrically conductive material. One portion of conductive layer 136 is electrically connected to contact pads 126 of semiconductor die 124. Other portions of conductive layer 136 can be electrically common or electrically isolated depending on the design and function of the semiconductor device.

Figure 3E:
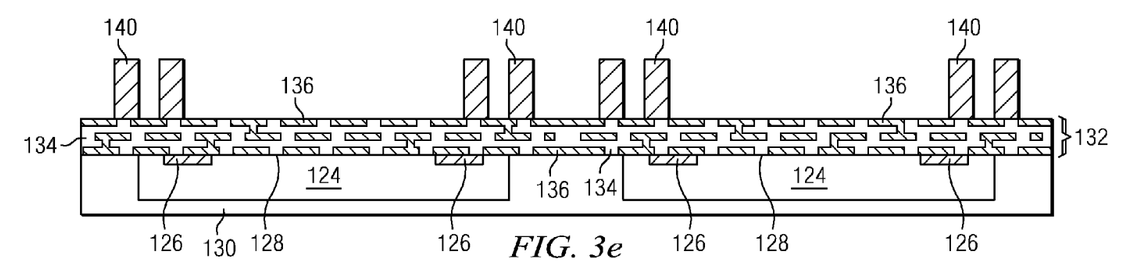

In FIG. 3e, one or more layers of photoresist are deposited over a surface of build-up interconnect structure 132 opposite semiconductor die 124. A portion of the photoresist is exposed and removed by an etch development process to form vias. Conductive material, such as Al, Cu, Sn, Ni, Au, Ag, titanium (Ti), tungsten (W), solder, poly-silicon, or combination thereof, is deposited in the vias using a selective plating process. The photoresist is stripped away leaving behind individual conductive pillars 140. In another embodiment, conductive pillars 140 can be formed as stud bumps or stacked bumps.

Figure 3F:
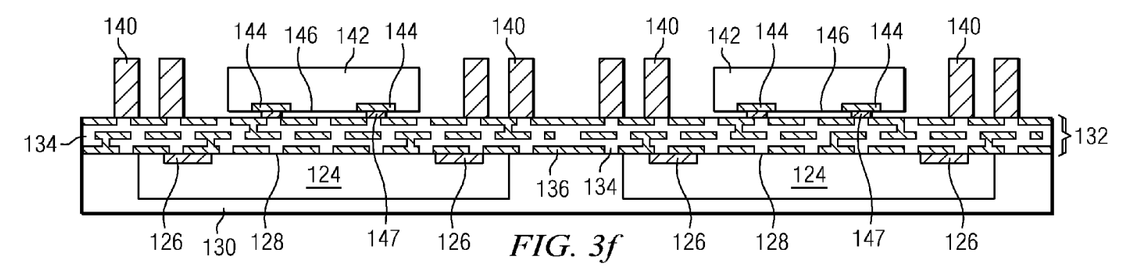

In FIG. 3f, semiconductor die or components 142 are mounted to conductive pillars 140 with contact pads 144 on active surface 146 oriented to the surface of build-up interconnect structure 132 opposite semiconductor die 124. Contact pads 144 are electrically connected to conductive layer 136 with bumps 147. Active surface 146 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 146 to implement analog circuits or digital circuits, such as DSP, ASIC, memory, or other signal processing circuit. Semiconductor die 142 may also contain IPD, such as inductors, capacitors, and resistors, for RF signal processing.

Figure 3G:
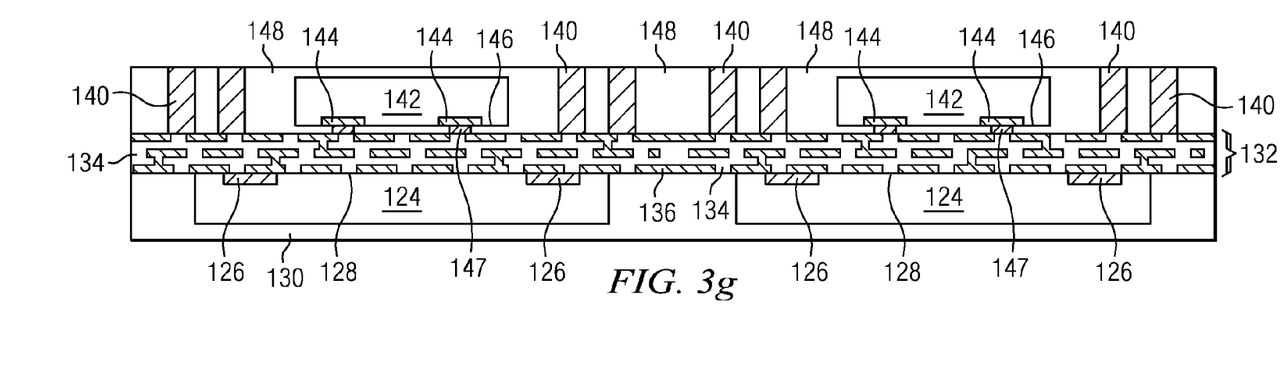

In FIG. 3g, an encapsulant or molding compound 148 is deposited over build-up interconnect structure 132 and semiconductor die 142 and around conductive pillars 140 using a paste printing, compressive molding, transfer molding, liquid encapsulant molding, vacuum lamination, spin coating, or other suitable applicator. Encapsulant 148 can be polymer composite material, such as epoxy resin with filler, epoxy acrylate with filler, or polymer with proper filler. Encapsulant 148 is non-conductive and environmentally protects the semiconductor device from external elements and contaminants. Encapsulant 148 is planarized by an etching process to expose conductive pillars 140.

In another embodiment, semiconductor die or components 142 are mounted with contact pads 144 on active surface 146 oriented to the surface of build-up interconnect structure 132 opposite semiconductor die 124 (without forming conductive pillars 140). Encapsulant 148 is deposited over build-up interconnect structure 132 and semiconductor die 142. A plurality of vias is formed in encapsulant 148 using laser drilling or etching process, such as DRIE. The vias are filled with Al, Cu, Sn, Ni, Au, Ag, titanium (Ti), W, poly-silicon, or other suitable electrically conductive material using PVD, CVD, electrolytic plating, electroless plating process, or other suitable metal deposition process to form conductive vias through encapsulant 148. The conductive vias are electrically connected to contact pads 144.

Figure 3H:
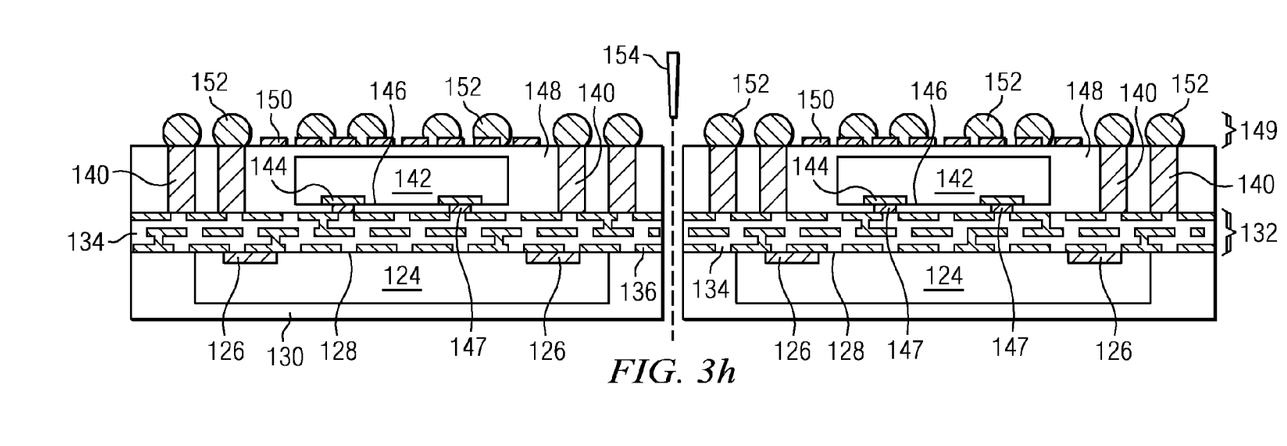

In FIG. 3h, an interconnect structure 149 is formed over encapsulant 148 and conductive pillars 140. An electrically conductive layer 150 is formed using a patterning and deposition process such as PVD, CVD, sputtering, electrolytic plating, and electroless plating process. Conductive layer 150 can be one or more layers of Al, Cu, Sn, Ni, Au, Ag, or other suitable electrically conductive material. Conductive layer 150 operates as an under bump metallization layer (UBM) and redistribution layer (RDL) for a greater input/output (I/O) pin count.

An electrically conductive bump material is deposited over conductive layer 150 and electrically connected to conductive pillars 140 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 150 using a suitable attachment or bonding process. In one embodiment, the bump material is reflowed by heating the material above its melting point to form spherical balls or bumps 152. In some applications, bumps 152 are reflowed a second time to improve electrical contact to conductive layer 150. The bumps can also be compression bonded to conductive layer 150. Bumps 152 represent one type of interconnect structure that can be formed over conductive layer 150. The interconnect structure can also use bond wires, stud bump, micro bump, or other electrical interconnect.

Figure 4:
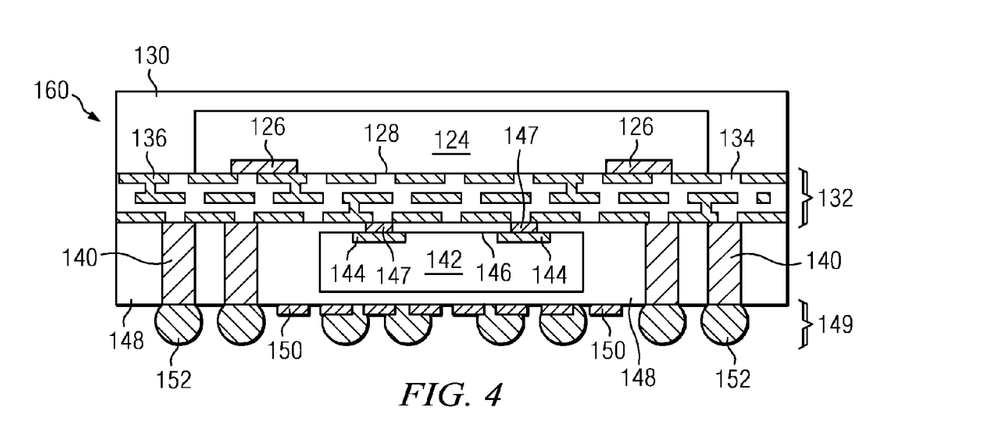
FIG. 4 illustrates the WLCSP with dual-molded semiconductor die mounted to opposite sides of build-up interconnect structure.

Semiconductor die 124 are singulated with saw blade or laser cutting device 154 into individual FO-WLCSP. FIG. 4 shows FO-WLCSP 160 after singulation. Semiconductor die 124 and 142 are mounted to opposite sides of and electrically interconnected through build-up interconnect structure 132. By mounting semiconductor die 124 and 142 to opposite sides of build-up interconnect structure 132, a greater utilization of the build-up interconnect structure can be achieved and its size can be reduced, which saves manufacturing cost. Encapsulant 130 and 148 are deposited around semiconductor die 124 and 142, respectively. Build-up interconnect structure 132 is electrically connected to RDL 150 and bumps 152 by z-direction interconnect conductive pillars 140, which are also covered by encapsulant 148. By dual molding of semiconductor die 124 and 142 and using conductive pillars 140 for z-direction interconnect and RDL 150 for lateral interconnect, the pitch of bumps 152 is reduced which increases the I/O pin count.

Figure 5:
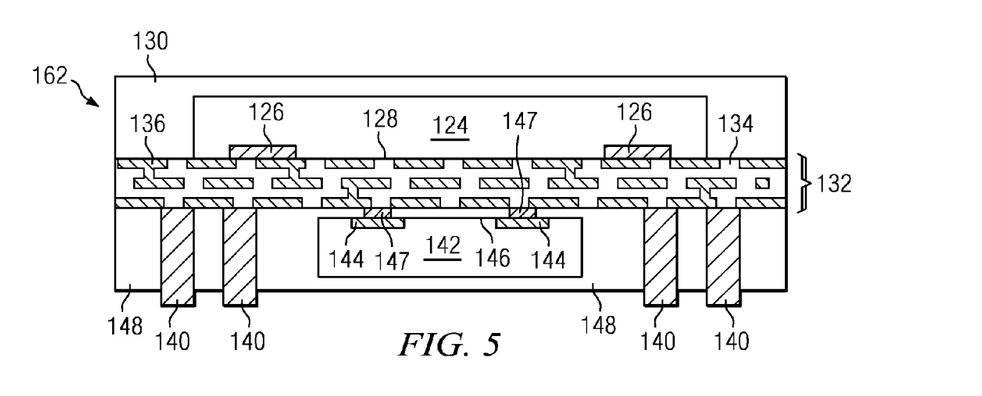
FIG. 5 illustrates the dual-molded die with conductive pillars extending from the encapsulant.

FIG. 5 shows FO-WLCSP 162 with conductive pillars 140 extending from encapsulant 148. In this embodiment, encapsulant 148 in FIG. 3g is etched back so that conductive pillars 140 protrude from the encapsulant for direct interconnect to other packages or devices.

Figure 6:
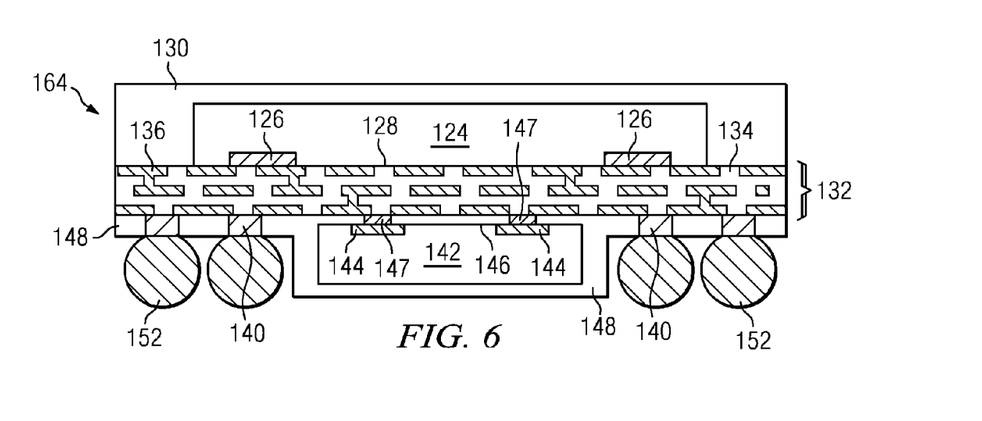
FIG. 6 illustrates the dual-molded die with the conductive pillars recessed with respect to the encapsulant.

FIG. 6 shows FO-WLCSP 164 with a reduced height for conductive pillars 140. In this embodiment, conductive pillars 140 and a portion of encapsulant 148 away from semiconductor die 142 in FIG. 3g are etched back with respect to a portion of encapsulant 148 over semiconductor die 142 to reduce the overall height of the FO-WLCSP.

Figure 7:
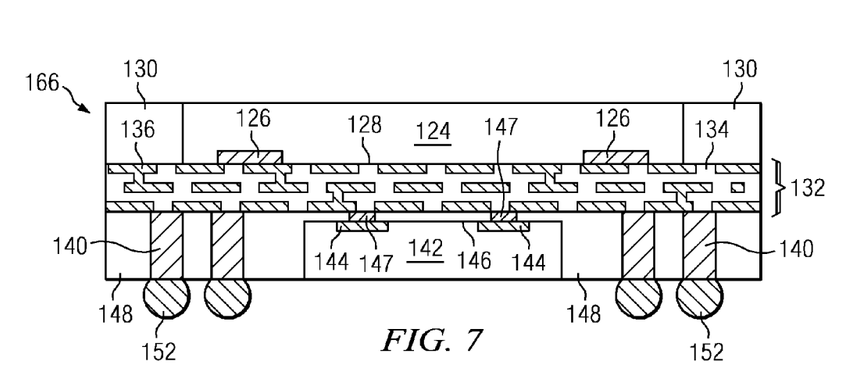
FIG. 7 illustrates the dual-molded die with an exposed backside of the lower and upper semiconductor die.

FIG. 7 shows FO-WLCSP 166 with conductive pillars 140 and encapsulant 148 planarized to expose a back surface of semiconductor die 142. Likewise, encapsulant 130 is planarized to expose a back surface of semiconductor die 124.

Figure 8:
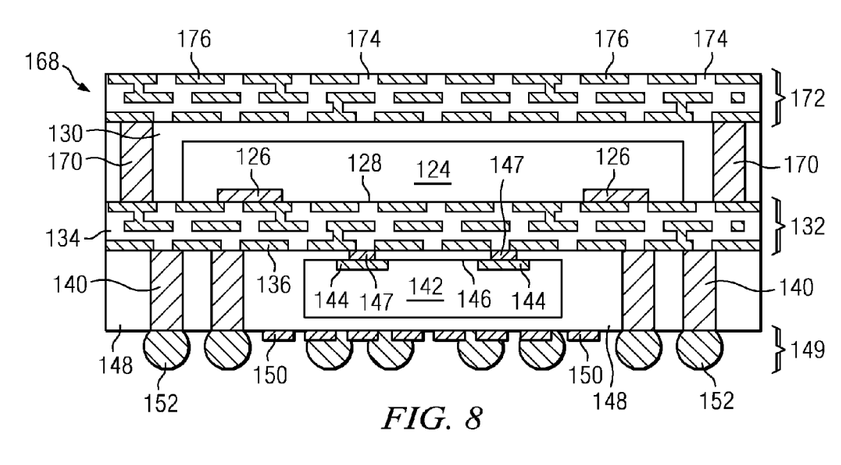
FIG. 8 illustrates a build-up interconnect structure formed over upper semiconductor die.

FIG. 8 shows FO-WLCSP 168 with conductive pillars 170 formed around semiconductor die 124 and build-up interconnect layer 172 formed over a surface of encapsulant 130. In this embodiment, one or more layers of photoresist are deposited over carrier 120 prior to depositing encapsulant 130 in FIG. 3c. A portion of the photoresist is exposed and removed by an etch development process to form vias. Conductive material, such as Al, Cu, Sn, Ni, Au, Ag, Ti, W, solder, poly-silicon, or combination thereof, is deposited in the vias using a selective plating process. The photoresist is stripped away leaving behind individual conductive pillars 170. In another embodiment, conductive pillars 170 can be formed as stud bumps or stacked bumps. The remainder of the structure is formed according to FIGS. 3c-3g.

A build-up interconnect structure 172 is formed over encapsulant 130 and conductive pillars 170. The build-up interconnect structure 172 includes an insulating or passivation layer 174 containing one or more layers of SiO2, Si3N4, SiON, Ta2O5, Al2O3, or other material having similar insulating and structural properties. The insulating layer 174 is formed using PVD, CVD, printing, spin coating, spray coating, sintering or thermal oxidation.

The build-up interconnect structure 172 further includes an electrically conductive layer 176 formed in insulating layer 174 using a patterning and deposition process such as PVD, CVD, sputtering, electrolytic plating, and electroless plating process. Conductive layer 176 can be one or more layers of Al, Cu, Sn, Ni, Au, Ag, or other suitable electrically conductive material. One portion of conductive layer 176 is electrically connected to conductive pillars 170. Other portions of conductive layer 176 can be electrically common or electrically isolated depending on the design and function of the semiconductor device.

Figure 9:
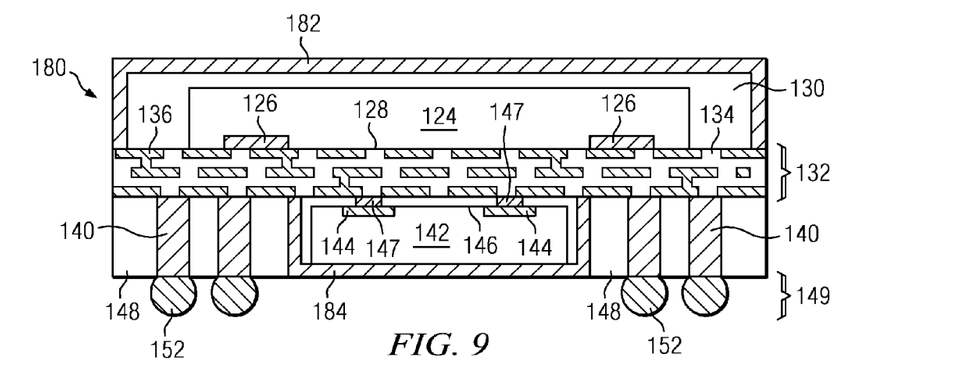
FIG. 9 illustrates an EMI shielding layer formed over upper semiconductor die.

In FIG. 9, FO-WLCSP 180 has shielding layer 182 formed over semiconductor die 124 and shielding layer 184 formed over semiconductor die 142. A portion of encapsulant 130 is removed for shielding layer 182, and a portion of encapsulant 148 is removed for shielding layer 184. Shielding layers 182 and 184 can be Cu, Al, ferrite or carbonyl iron, stainless steel, nickel silver, low-carbon steel, silicon-iron steel, foil, epoxy, conductive resin, and other metals and composites capable of blocking or absorbing electromagnetic interference (EMI), radio frequency interference (RFI), and other inter-device interference. Shielding layers 182 and 184 can also be a non-metal material such as carbon-black or aluminum flake to reduce the effects of EMI and RFI.

Figure 10:
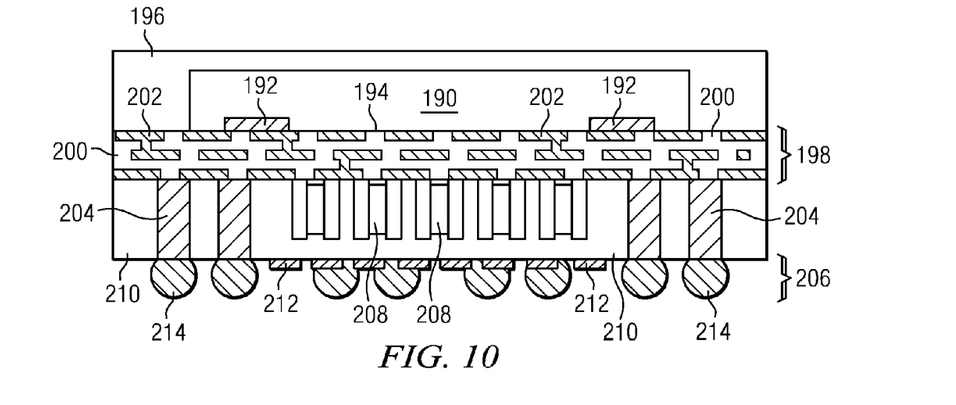
FIG. 10 illustrates discrete semiconductor components mounted to build-up interconnect structure.

In FIG. 10, semiconductor die or components 190 are mounted to a temporary carrier with contact pads 192 on active surface 194 oriented toward the carrier. Active surface 194 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 194 to implement analog circuits or digital circuits, such as DSP, ASIC, memory, or other signal processing circuit. Semiconductor die 190 may also contain IPD, such as inductors, capacitors, and resistors, for RF signal processing. A typical RF system requires multiple IPDs in one or more semiconductor packages to perform the necessary electrical functions.

An encapsulant or molding compound 196 is deposited over the carrier and semiconductor die 190 using a paste printing, compressive molding, transfer molding, liquid encapsulant molding, vacuum lamination, spin coating, or other suitable applicator. Encapsulant 196 can be polymer composite material, such as epoxy resin with filler, epoxy acrylate with filler, or polymer with proper filler. Encapsulant 196 is non-conductive and environmentally protects the semiconductor device from external elements and contaminants.

The intermediate structure is inverted and the temporary carrier is removed by chemical etching, mechanical peel-off, CMP, mechanical grinding, thermal bake, laser scanning, or wet stripping. A build-up interconnect structure 198 is formed over semiconductor die 190 and encapsulant 196. The build-up interconnect structure 198 includes an insulating or passivation layer 200 containing one or more layers of SiO2, Si3N4, SiON, Ta2O5, Al2O3, or other material having similar insulating and structural properties. The insulating layer 200 is formed using PVD, CVD, printing, spin coating, spray coating, sintering or thermal oxidation.

The build-up interconnect structure 198 further includes an electrically conductive layer 202 formed in insulating layer 200 using a patterning and deposition process such as PVD, CVD, sputtering, electrolytic plating, and electroless plating process. Conductive layer 202 can be one or more layers of Al, Cu, Sn, Ni, Au, Ag, or other suitable electrically conductive material. One portion of conductive layer 202 is electrically connected to contact pads 192 of semiconductor die 190. Other portions of conductive layer 202 can be electrically common or electrically isolated depending on the design and function of the semiconductor device.

One or more layers of photoresist are deposited over a surface of build-up interconnect structure 198 opposite semiconductor die 190. A portion of the photoresist is exposed and removed by an etch development process to form vias. Conductive material, such as Al, Cu, Sn, Ni, Au, Ag, Ti, W, solder, poly-silicon, or combination thereof, is deposited in the vias using a selective plating process. The photoresist is stripped away leaving behind individual conductive pillars 204. In another embodiment, conductive pillars 204 can be formed as stud bumps or stacked bumps.

A plurality of discrete semiconductor components 208 is mounted between conductive pillars 204 to the surface of build-up interconnect structure 198 opposite semiconductor die 190. Discrete semiconductor components 208 can be resistors, capacitors, inductors, or discrete active devices.

An encapsulant or molding compound 210 is deposited over build-up interconnect structure 198 and discrete semiconductor components 208 using a paste printing, compressive molding, transfer molding, liquid encapsulant molding, vacuum lamination, spin coating, or other suitable applicator. Encapsulant 210 can be polymer composite material, such as epoxy resin with filler, epoxy acrylate with filler, or polymer with proper filler. Encapsulant 210 is non-conductive and environmentally protects the semiconductor device from external elements and contaminants.

An interconnect structure 206 is formed over encapsulant 210. An electrically conductive layer 212 is formed using a patterning and metal deposition process such as PVD, CVD, sputtering, electrolytic plating, and electroless plating. Conductive layer 212 can be one or more layers of Al, Cu, Sn, Ni, Au, Ag, or other suitable electrically conductive material. Conductive layer 212 operates as UBM and RDL for a greater I/O pin count.

An electrically conductive bump material is deposited over conductive layer 212 and electrically connected to conductive pillars 204 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 212 using a suitable attachment or bonding process. In one embodiment, the bump material is reflowed by heating the material above its melting point to form spherical balls or bumps 214. In some applications, bumps 214 are reflowed a second time to improve electrical contact to conductive layer 212. The bumps can also be compression bonded to conductive layer 212. Bumps 214 represent one type of interconnect structure that can be formed over conductive layer 212. The interconnect structure can also use bond wires, stud bump, micro bump, or other electrical interconnect.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first semiconductor die;
   forming a first interconnect structure over the first semiconductor die;
   disposing a second semiconductor die over the first interconnect structure opposite the first semiconductor die with an active surface of the second semiconductor die oriented toward an active surface of the first semiconductor die; and
   forming a second interconnect structure directly over the first semiconductor die, over the first interconnect structure, and around the second semiconductor die.

2. The method of claim 1, wherein forming the first interconnect structure includes:
   forming a conductive layer over the first semiconductor die; and
   forming an insulating layer over the conductive layer.

3. The method of claim 1, wherein the second interconnect structure includes a bump or conductive pillar.

4. The method of claim 1, further including depositing an encapsulant over the first semiconductor die or second semiconductor die.

5. The method of claim 1, further including forming a first shielding layer over the first semiconductor die opposite the first interconnect structure.

6. The method of claim 1, further including disposing a second shielding layer disposed the second semiconductor die opposite the first interconnect structure.

7. A method of making a semiconductor device, comprising:
   providing a first semiconductor die;
   disposing a second semiconductor die over the first semiconductor die; and
   disposing a first interconnect structure directly over the first semiconductor die and around the second semiconductor die.

8. The method of claim 7, further including disposing a second interconnect structure between the first semiconductor die and second semiconductor die.

9. The method of claim 8, wherein an active surface of the second semiconductor die is oriented toward the second interconnect structure.

10. The method of claim 7, further including depositing an encapsulant over the first semiconductor die or second semiconductor die.

11. The method of claim 7, further including forming a second interconnect structure around the first semiconductor die.

12. The method of claim 7, wherein the first interconnect structure includes a bump or a conductive pillar.

13. The method of claim 7, further including forming a conductive layer between the first semiconductor die and second semiconductor die.

14. A method of making a semiconductor device, comprising:
   providing a first semiconductor die;
   disposing a first shielding layer over the first semiconductor die;
   disposing a first interconnect structure over the first semiconductor die opposite the first shielding layer; and
   disposing a second interconnect structure around the first semiconductor die.

15. The method of claim 14, further including disposing a second semiconductor die over the first semiconductor die.

16. The method of claim 15, further including forming a third interconnect structure over the second semiconductor die.

17. The method of claim 15, further including forming a conductive layer between the first semiconductor die and second semiconductor die.

18. The method of claim 15, wherein an active surface of the second semiconductor die is oriented toward the second interconnect structure.

19. The method of claim 14, further including forming a third interconnect structure around the first semiconductor die.

20. The method of claim 14, wherein the first interconnect structure includes a bump or a conductive pillar.

21. A semiconductor device, comprising:
a first semiconductor die;
a second semiconductor die disposed over the first semiconductor die;
a first interconnect structure disposed between the first semiconductor die and the second semiconductor die; and
a second interconnect structure disposed directly over the first semiconductor die and around the second semiconductor die.

22. The semiconductor device of claim 21, wherein an active surface of the second semiconductor die is oriented toward an active surface of the first semiconductor die.

23. The semiconductor device of claim 21, further including a first shielding layer disposed over the first semiconductor die opposite the first interconnect structure.

24. The semiconductor device of claim 21, further including a second shielding layer disposed over the second semiconductor die opposite the first interconnect structure.

25. The semiconductor device of claim 24, wherein the second shielding layer is disposed entirely within a footprint of the first semiconductor die.

\* \* \* \* \*